(12) United States Patent
Srinivasan et al.

(10) Patent No.: US 6,262,616 B1
(45) Date of Patent: Jul. 17, 2001

(54) OPEN LOOP SUPPLY INDEPENDENT DIGITAL/LOGIC DELAY CIRCUIT

(75) Inventors: Vishnu S. Srinivasan; John Pacourek; John James Paulos, all of Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 09/415,136

(22) Filed: Oct. 8, 1999

(51) Int. Cl.[7] .................................................. G11C 5/14
(52) U.S. Cl. ....................... 327/264; 327/285; 327/288; 327/538; 327/537; 331/57
(58) Field of Search .................................. 327/285, 278, 327/272, 281, 288, 530, 538; 331/57

(56) References Cited

U.S. PATENT DOCUMENTS

| | | | |
|---|---|---|---|
| 3,599,011 | 8/1971 | Zwolle . | |
| 4,496,861 | 1/1985 | Bazes | 327/161 |
| 4,623,805 | 11/1986 | Flora et al. | 327/152 |
| 4,641,048 | 2/1987 | Pollock | 327/262 |
| 4,737,670 | 4/1988 | Steven | 327/278 |
| 4,791,326 | 12/1988 | Vajdic et al. | 327/391 |
| 4,853,654 | 8/1989 | Sakurai | 331/57 |
| 5,164,621 | 11/1992 | Miyamoto | 331/57 |
| 5,544,120 | 8/1996 | Kuwagata et al. | 331/57 |
| 5,559,476 | 9/1996 | Zhang | 331/57 |
| 5,600,280 | 2/1997 | Zhang | 327/180 |
| 5,731,727 | * 3/1998 | Iwamoto et al. | 327/281 |
| 6,044,027 | * 3/2000 | Zheng et al. | 327/261 |

FOREIGN PATENT DOCUMENTS

401041312A * 2/1989 (JP) ..................................... 327/281

OTHER PUBLICATIONS

Conroy, C S G et al.; "An 8–B 85–MS/S Parallel Pipeline A/D Converter in 1–μm CMOS"; IEEE Journal of Solid–State Circuits, U. S., IEEE Inc. New York; vol. 28, No. 4, Apr. 1, 1993; pp. 447–454.

* cited by examiner

Primary Examiner—Dinh T. Le
(74) Attorney, Agent, or Firm—Blakely Sokoloff Taylor & Zafman

(57) ABSTRACT

A technique for compensating for supply voltage variations in a delay circuit by utilizing a bias circuit to maintain the delay substantially constant with respect to the supply voltage. The bias circuit generates a bias current having a fixed component and a variable component, in which the variable component varies proportionately to variations in the supply voltage to maintain the delay substantially constant.

25 Claims, 7 Drawing Sheets

OPEN LOOP SUPPLY INDEPENDENT DIGITAL/LOGIC DELAY CIRCUIT

BACKGROUND OF THE INVENTION

1. Field of the Invention

The present invention relates to the field of timing integrated circuits and, more particularly, to circuits for providing timing delays.

2. Background of the Related Art

The use of delay circuits to delay a signal has many applications in circuit design. Generally, a delay circuit operates by receiving an input signal and generating an output signal which is delayed by some time period from the input signal. The output can be a reproduction of the input signal delayed by some time t or it can be a separate signal commencing at the delayed time t from the input signal. For example, the input signal can be a digital clocking signal and the output signal can be a delayed clocking signal, so that a positive edge transition of the output clock signal is delayed by time t from the positive edge transition of the input signal.

In some instances, it is desirable to output more than one clocking signal based on a reference input. For example, for a given reference input, a first delayed signal is generated at time $t_1$ and a second delayed signal is generated at time $t_2$. The triggering of the second delayed signal can be based on the reference signal or the first delayed signal. For example, after the first signal commences at delay time $t_1$, it can be made to transition again (return to the original state) at time $t_2$. This second transition of the first signal can be used to trigger the second output signal. Clocking schemes of this type are utilized when two delayed clocking signals are required, but where the second signal is to occur after completion of the first.

A problem with this type of scheme is that the second output is dependent on the first for the timing. Any variations in the delay of the first output will impact the commencement of the second output. In a circuit where the first output triggers the second output, delay variations of the first output will alter the delay of the second output. It may further alter the pulse-width of the second output, in the instance the second clocking signal is made to transition again (return to the original state) at the transition of the original reference signal.

Accordingly, maintaining a relatively steady delay for the output signals, especially for the first signal, allows for tighter design tolerances. In order to achieve better control of delays, closed loop controls can be used. For example, a delay lock loop (DLL) can be used to adjust for any delay variations. DLLs are effective, but require more circuit complexity to provide the feedback to correct for unwanted variations in the signal. Alternatively, open loop control mechanisms can be used. Open loop systems are simpler to implement than closed loop systems, but may be more susceptible to circuit and environment variations, such as changes in temperature, supply voltage or process parameters which affect transistor performance (process corners). Where these variations are encountered, the open loop system may have difficulty in maintaining the desired delay in the delay circuit described above.

The present invention addresses the above concern of providing a desired delay, while utilizing an open loop control system to maintain the delay substantially steady with respect to supply voltage.

SUMMARY OF THE INVENTION

An open-loop supply independent digital/logic delay circuit is described. A delay circuit, comprised of a series of inverters, receives an input reference signal and generates an output which is delayed from the input signal. The delay is achieved by the response of each stage in transitioning the input signal to the next stage. A bias circuit is coupled to the delay circuit and utilized to control the current flow in the inverter stages, so that when a voltage to the inverter changes, the current flow is changed substantially proportionally to the voltage to maintain the delay substantially constant with respect to the voltage.

DETAILED DESCRIPTION OF THE INVENTION

Figure 1:
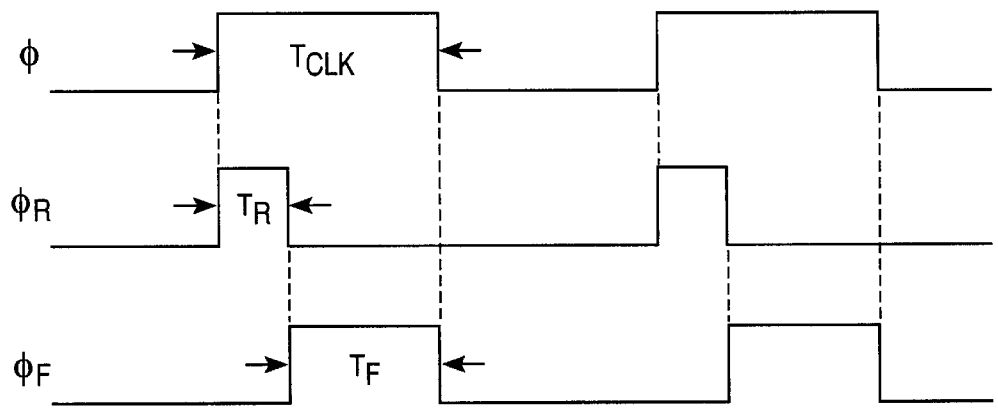
FIG. 1 is a timing diagram showing a reference clock signal, a first output signal triggered by the reference signal and a second output signal delayed from the reference signal by a delay determined by the first output signal.

Referring to FIG. 1, a timing diagram 10 is shown in which a reference clocking signal is noted as φ. The signal φ is a typical clocking signal (square-wave) having high and low transitions. The signal φ has a high state duty cycle of 50% (although the duty cycle need not necessarily be 50%) with the period of the positive half-cycle shown as $T_{CLK}$. The reference signal φ is utilized to generate two delayed signals, indicated as $\phi_R$ and $\phi_F$ in FIG. 1.

The signal $\phi_R$ has a positive (low-to-high) transition which is triggered by the leading edge transition of $T_{CLK}$. The pulse-width of $\phi_R$ is designated $T_R$ and has a duration shorter than $T_{CLK}$. The start of the second signal $\phi_F$ commences at the trailing edge (high-to-low transition) of $\phi_R$. Thus, when $\phi_R$ transitions low, it triggers the commencement of $\phi_F$. The trailing edge of $\phi_F$ occurs at the trailing edge of φ. That is, when φ transitions low, it causes $\phi_F$ to transition low as well. The width of $\phi_F$ is noted as $T_F$. Accordingly, $T_{CLK}=T_R+T_F$ for the example shown. It is appreciated that $T_R+T_F$ may not equal $T_{CLK}$ for all cases, in which event $T_R+T_F$ can be greater or less than $T_{CLK}$.

As noted in FIG. 1, the signal $\phi_F$ is delayed from the reference signal φ by the delay period $T_R$. That is, the leading edge of occurs a time period $T_R$ after the leading edge of ϕ. This delay is determined by the duration of the high portion $T_R$ of the signal ϕ$_R$. Since ϕ$_R$ triggers on ϕ, the delay is actually determined by the occurrence of the trailing edge of ϕ$_R$, at which point ϕ$_F$ is triggered.

Figure 2:
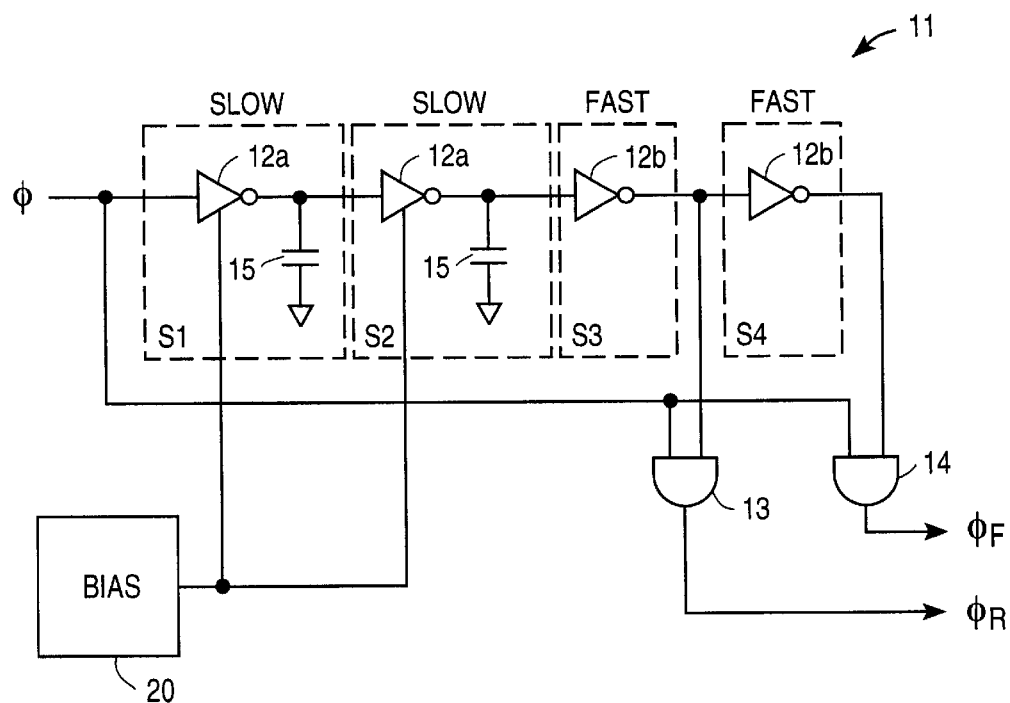
FIG. 2 is a block schematic diagram showing the generation of the output signals of FIG. 1 in response to the reference clock signal by using inverter stages, which are under control of a biasing circuit of the present invention.

A variety of circuits can be implemented to provide the two signals ϕ$_R$ and ϕ$_F$ from ϕ. Once such implementation is illustrated in the block diagram of FIG. 2. The exemplary delay circuit 11 of FIG. 2 is comprised of four inverter stages S1–S4. Each stage is comprised of at least one inverter 12a or 12b (depending on the use of the stage). Signal ϕ is input to the first stage S1. As ϕ is coupled through each stage, the delay built into each stage adds to the delay. As noted below, the slow stages provide more delay than fast stages.

In the circuit 11, the first two stages S1, S2 are defined as slow stages and provide most of the delay through circuit 11. The last two stages S2, S3 are defined as fast stages. The fast stage inverters 12b are simple inverters and respond quickly to an input. Accordingly, inverters 12b of stages S3, S4 have insignificant delay when compared to the stages S1 and S2. The delays imposed on S1 and S2 are circuit delays introduced by the presence of circuit components in the stages S1, S2. In the example, capacitive loading (shown as capacitor 15) at the output of the S1 and S2 inverters introduce fixed delay due to input current charging of the capacitors. Capacitor 15 actually denotes both the intentional capacitive loading of the stage, as well as any other capacitive loading inherent in the circuit, such as the loading of the next inverter stage. Since the next inverter stage requires a certain voltage level to switch the inverter (normally or designed to be Vdd/2 for the transition level), the current charging of the loading capacitor adds a lag time to reach this level. The last two stages S3, S4 lack the deliberate loading and are simple inverters. Hence, the stages S3, S4 transition almost immediately. Any delay in S3 and S4 is miniscule in comparison to S1 and S2. Inverters 12b of the fast stages S3, S4 are used to provide sharp transitions that are then used or combined with the input signal to generate delay signals ϕ$_R$ and ϕ$_F$.

Figure 8:
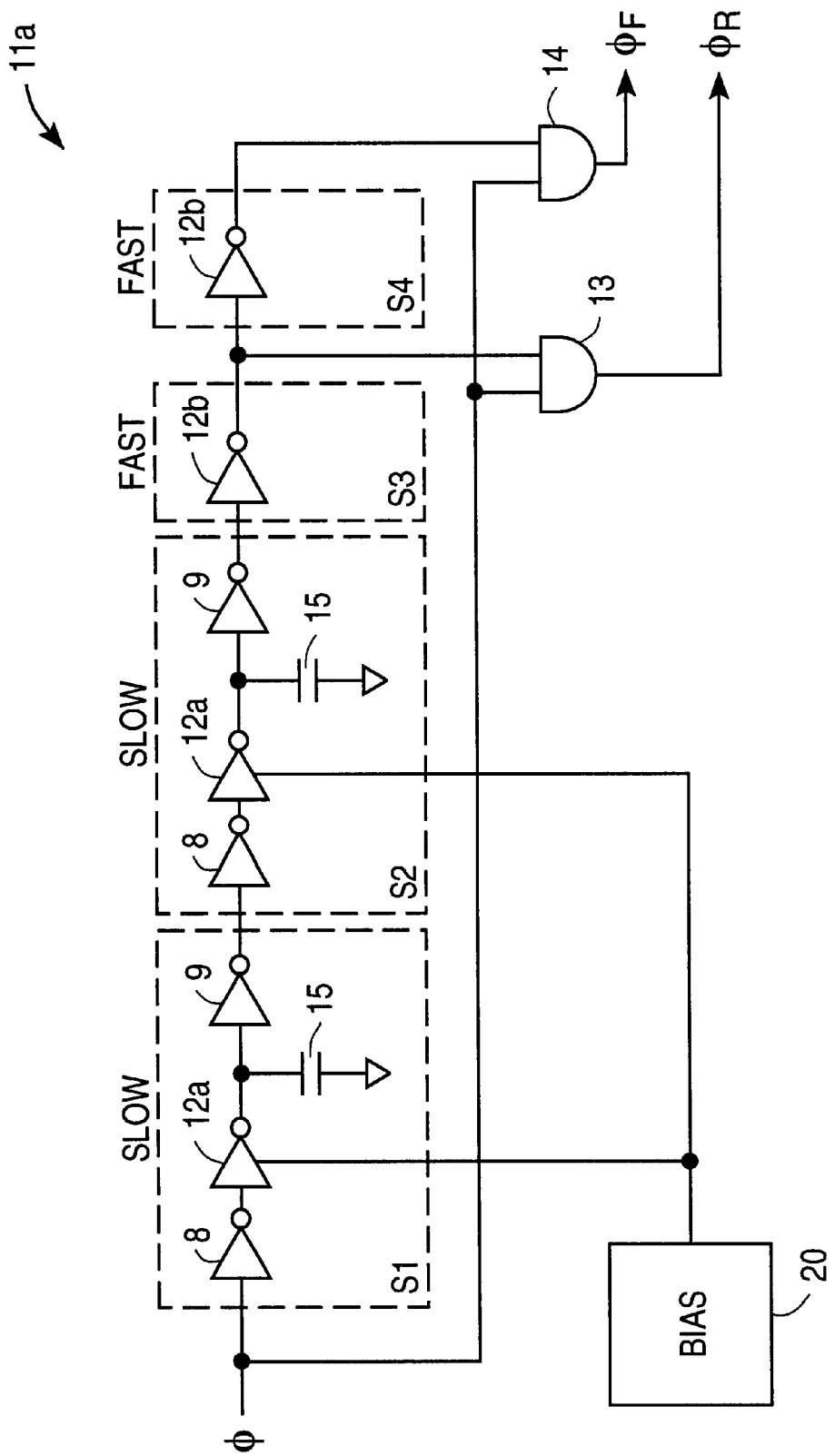
FIG. 8 is a block schematic diagram of FIG. 2, but also utilizing inverters in the slow stages to improve signal edge transitions.

The output of the third stage S3 is ANDed with the reference input ϕ by AND gate 13 to provide the output ϕ$_R$. Likewise, the output of the last stage S4 is ANDed with ϕ by AND gate 14 to provide the output ϕ$_F$. Logic shows that the output of the S3 inverter is an inverted and delayed version of the reference signal ϕ. That is, the output of S3 is a delayed ϕ# (the # indicating that it is NOTϕ). When the two signals are ANDed by AND gate 13, the resulting output is ϕ$_R$. The amount of the delay between the input to S1 and the output at S3 determines when the trailing edge occurs for ϕ$_R$. The S1 and S2 delays are combined together to generate the $T_R$ and $T_F$ delays. By having one rise transition and the other a fall transition, some immunity to process/device type variations is also achieved for improved duty cycle response. Accordingly, the signal $T_R$ is determined by the logic of combining the input signal ϕ and its delayed signal at the output of the stage S3, while the signal $T_F$ is determined by the logic of combining the input signal ϕ and its delayed signal at the output of stage S4. It is also to be noted that an alternative embodiment of the circuit 11 is shown in FIG. 8 and described later.

That is, since the output of the last stage S4 is the inverse of the output of S3, the effect is for ϕ to be ANDed with a delayed ϕ at AND gate 14 to generate ϕ$_F$. However, since the delay is determined by S1 and S2, the trigger point is at delay $T_R$. Accordingly, when ϕ$_R$ transitions low, ϕ$_F$ is triggered. ϕ$_F$ remains high until ϕ goes low at the input. Therefore, the circuit 11 can provide the two outputs ϕ$_R$ and ϕ$_F$ synchronized to the reference clock ϕ, wherein the delay $T_R$ is the delay of S1+S2. In one particular application, $T_{CLK}$ is 80 nanoseconds (nsec), $T_R$ is 15 nsec and $T_F$ is 65 nsec. In another application each of the duration are twice as long (160 nsec, 30 nsec and 130 nsec, respectively). It is appreciated that the signals and the delay can be designed for various duration. The above values are provided to illustrate that the delay can be down in the nanosecond range or much longer.

Also shown in FIG. 2 is a bias circuit 20, which is described in detail below. The bias circuit 20 is coupled to the inverter stages 12a, which provide the delay for the circuit 11. The bias circuit 20 is utilized to provide open loop compensation (or biasing) to maintain the desired delays, when voltage (such as supply voltage) changes. It is appreciated that various factors (including the supply voltage) can influence the charge cycle of the inverter stages, which will impact the delay through the inverter stages. This is better illustrated in reference to FIG. 3.

Figure 3:
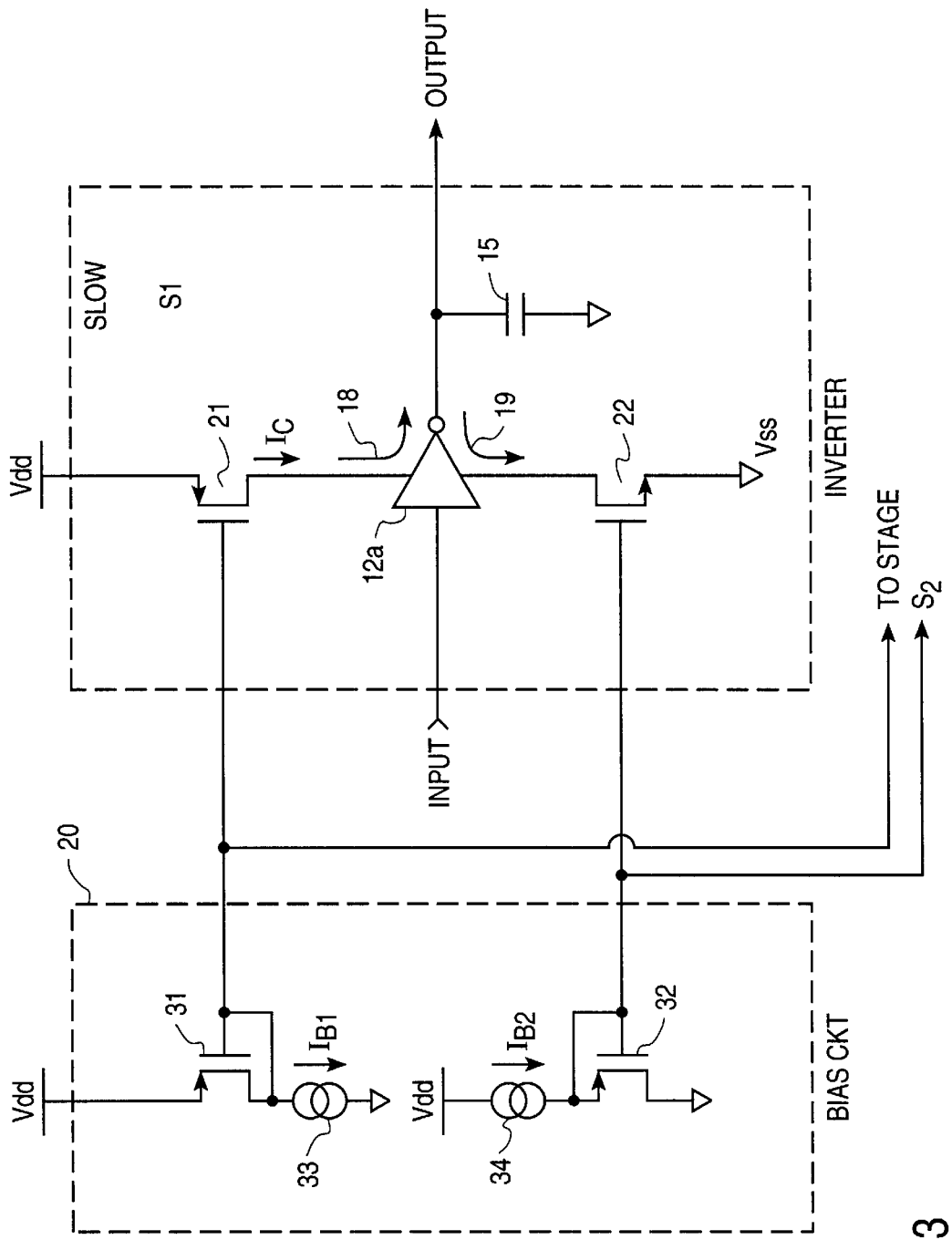
FIG. 3 is a circuit schematic diagram showing one of the inverter stages and the bias circuit of FIG. 2, in which the bias circuit is used to compensate for variation in the supply voltage to maintain a substantially constant delay.

In FIG. 3, a slow inverter stage, which can be either stage S1 or S2, is shown. The charging and discharging of the capacitor 15 are noted by current arrows 18 and 19. If the inverter 12a operated normally without compensation, the delay will be determined by the time needed to charge or discharge the capacitor 15, in response to the input signal, to switch the inverter of the subsequent stage. Assuming that the next stage inverter switches at Vdd/2, the delay will be determined by the amount of time required for the output to reach Vdd/2 from Vdd or Vss (which is ground in the example) in response to the input state change.

If circuit parameters did not change, then the delay will remain substantially constant. However, if parameters change, the delay may also change. For example, if Vdd varied from a constant value, the charging/discharging current of inverter 12a will vary proportionately. For example if Vdd increased in value, the charging current increases proportionately, since the gate voltage (Vgs) also increases. This results in a faster ramp-up/ramp-down. Accordingly, if the switching point of the next stage was to remain substantially same as the supply voltage Vdd increases, the delay (½ $T_R$ in this instance where S1 and S2 provide the total delay of $T_R$) decreases, assuming that Vdd of the next stage remains substantially constant. Conversely, if Vdd decreases, delay increases. There is an inverse relationship between Vdd and the delay.

Thus, when only the inverter is present (without the bias circuit 20), the switching point at the output of the inverter will vary inversely to a supply voltage change. This is not a problem where circuit parameters or requirements are kept relatively constant, so that supply voltage variations are not encountered. However, as products are designed with specifications allowing for a significant variation in the supply voltage, some means for compensating for the delay variation is required. For example, an integrated circuit designed for operation over a significant range of the supply voltage may encounter substantial variation in the delay, depending on the actual supply voltage selected.

The circuit shown in FIG. 3 and described below incorporates the bias circuit 20 to provide open-loop control of the charging/discharging of the inverter 12a to maintain a fairly constant delay through the stage, across a range of the supply voltage. Accordingly, the bias circuit 20 compensates for supply voltage variations to maintain a relative constant delay. The compensation scheme is applicable for use in the delay circuit to compensate for supply voltage changes occurring during normal operation of the circuit or in designing a circuit which can operate across a range of supply voltages.

In FIG. 3, a PMOS transistor 21 and an NMOS transistor 22 are shown coupled with the inverter 12 between Vdd and ground (Gnd). The design is a typical complementary metal-oxide semiconductor (CMOS) circuit. The gates of the transistors 21, 22 are coupled to the gates of corresponding pair of transistors 31, 32. As configured, the transistors 21, 31 form a current mirror, so that if the transistor 31 functions as a current source 33, having a bias current $I_{B1}$, then the bias current $I_{B1}$ flows through the transistor 21. Likewise, by having the transistors 22, 32 operate as a current mirror, the bias current $I_{B2}$ of the transistor 32 is made to flow through the transistor 22. Thus, controlling the bias currents $I_{B1}$ and $I_{B2}$ allows charge/discharge currents (shown by arrows 18, 19) to be controlled.

It is to be noted that if the bias current $I_{B1}$ and $I_{B2}$ are kept constant, the charge/discharge current will also be constant. If this inverter current is kept constant, a variation in the supply voltage will have an opposite effect. That is, the rate of charging the capacitor 15 will remain the same, but the switching point of Vdd/2 will shift. Thus, if Vdd increases in value, it will take a longer time for the capacitor charge to reach Vdd/2. There is a direct relationship to the first order between the supply voltage and the delay, when the inverter current is kept constant.

The present invention utilizes the bias circuit 20 to vary the current through the inverter in a proportionate manner so that when the supply voltage changes, the current change offsets (or compensates) any delay variation caused by the change in the supply voltage. That is, where there is an increase in the supply voltage, the bias circuit 20 controls the amount of the current increase through the inverter to ensure that the amount of delay is maintained constant or at least within an acceptable tolerance.

To obtain the proper relationship, it is known that current i=C dv/dt. Thus, the charge/discharge current $I_C$ through the inverter is determined by C dv/dt, so that $I_C$/C determines the slope of the voltage change (dv/dt). Assuming that the next stage switches when the voltage at the output reaches Vdd/2, the relationship (Vdd/2)/($I_C$/C) quantifies the time required for the output of the inverter to reach Vdd/2. Accordingly, the delay induced by the stage can be quantified as (Vdd/2)×(C/$I_C$)=(C×Vdd)/ 2$I_C$=stage delay, which should remain constant.

Since $I_C$ is directly related to Vdd in the above equation and since C/2 is a constant, to ensure a substantially constant stage delay, $I_C$ is varied proportionally to Vdd. That is, if Vdd increases in value, a proportional increase in $I_C$ maintains the stage delay to be substantially constant. This proportional change in $I_C$ is controlled by the bias circuit 20.

Figure 4:
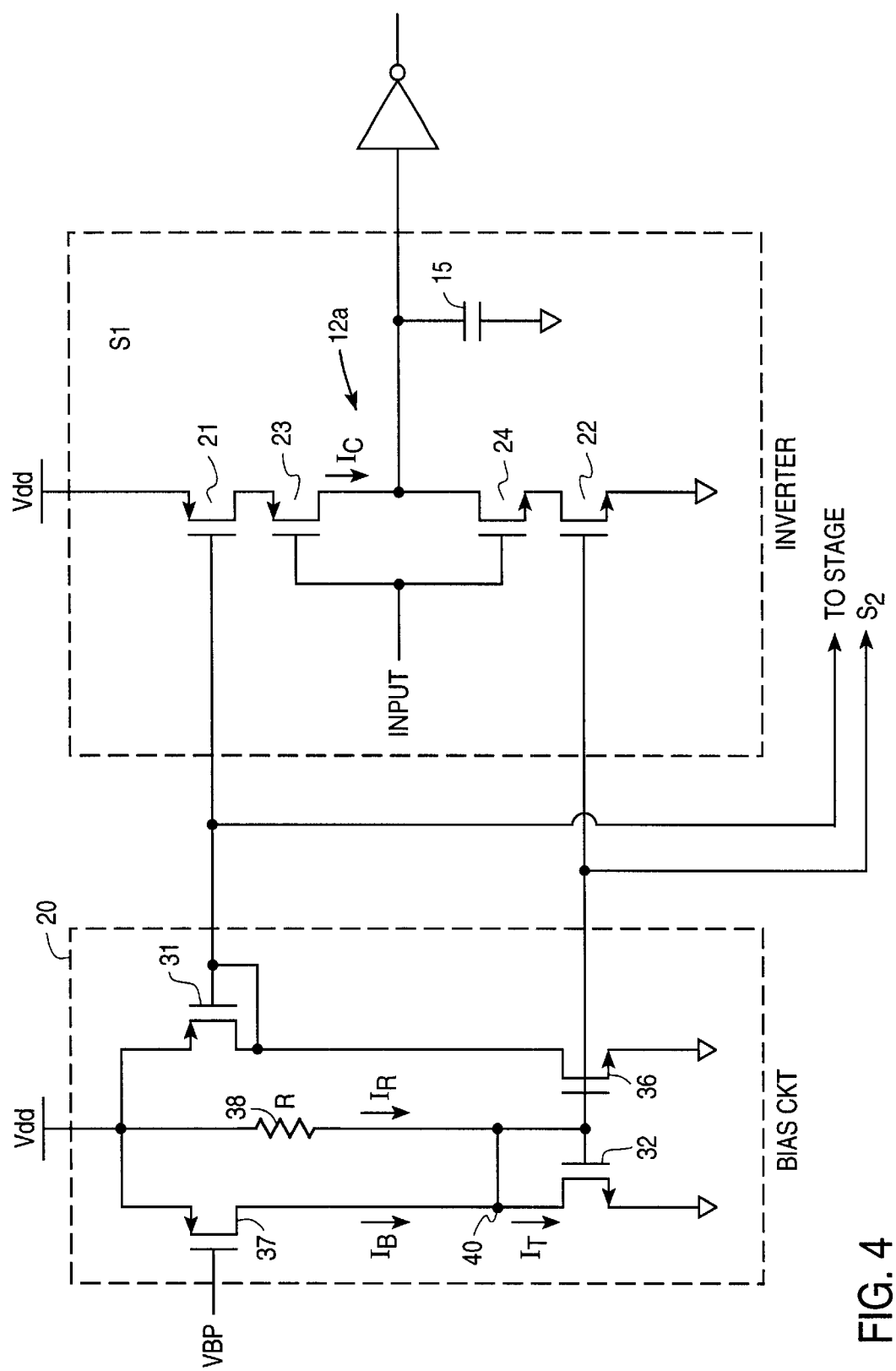
FIG. 4 is a schematic circuit diagram showing one embodiment of the bias circuit of FIG. 3.

Although various circuits can be designed to provide this compensation, one embodiment is shown in FIG. 4. In FIG. 4, one of the inverters 12a is shown in its CMOS components, which are transistors 23 and 24. The bias circuit operates by having one current source, so that $I_{B1}$ and $I_{B2}$ of FIG. 3 are represented by the current $I_T$. A transistor 36 is placed in line with transistor 31 to provide the mirror current of $I_T$ for driving the driver transistor 31. Accordingly, transistors 32 and 22 operate as a current mirror to provide the mirror current of $I_T$ to the NMOS branch of the inverter stage. Transistor 32 and 36 operate as a current mirror to place $I_T$ as the driving current of transistor 31. Transistors 31 and 21 operate as a current mirror to provide a mirror current of $I_T$ on the PMOS branch of the inverter. Thus, the inverter current is also $I_T$.

As shown, the $I_T$ component is comprised of $I_B$ and $I_R$. A PMOS transistor, in line with transistor 32, provides the drive for $I_B$. The input to the transistor 37 is a reference bias potential ($V_{BP}$). The reference voltage $V_{BP}$ is made to vary with Vdd, such that it is independent of supply voltage variation, at least to the first order. Thus, when Vdd changes, $V_{BP}$ changes correspondingly to drive the transistor 37, so that current $I_B$ stays relatively constant. That is, $I_B$ remains substantially constant as Vdd varies.

The other component of $I_T$ is $I_R$. A resister (R) 38 is placed in parallel to the transistor 37, between Vdd and node 40. Since R is constant, the current $I_R$ through this resistance branch varies as Vdd varies. Therefore, any change in $I_T$ is due to a change in $I_R$. The current $I_R$ can be calculated as $$(Vdd-(V_{TH}+V_{ON}))/R,$$

where $V_{TH}$ is the threshold voltage and $V_{ON}$ is the turn on voltage of the transistor 32 ($V_{TH}+V_{ON}$ is the voltage $V_N$ at the node 40). This relationship results in $I_R$=(Vdd−$V_N$)/R, and $I_T$=$I_B$+ (Vdd−$V_{TH}$−$V_{ON}$)/R. In most instances $V_{TH}$ is much greater than $V_O$, so that $1_R$=(Vdd−$V_{TH}$)/R.

If the supply voltage varied between two extremes of Vdd, only the $I_R$ component of $I_T$ will change in order to maintain the relationship ($I_B$+$I_R$)Vdd=constant k, or ($I_B$+$I_R$)=kVdd, so that the delay also remains constant. If Vdd is to vary over a range ΔV then, $I_R$ will need to vary over the range Δ$I_R$ to maintain the same delay. Thus, if Vdd changed its value from $Vdd_1$ to $Vdd_2$, $I_R$ would also need to change proportionately. An example is provided below in which the relationship between $I_B$ and R can be determined to maintain a constant delay by varying only the current $I_R$.

With the change of the supply voltage from $Vdd_1$ to $Vdd_2$, the following relationships apply. Corresponding total currents are noted as $I_{T1}$ and $I_{T2}$, where $$I_{T1}=I_B+(Vdd_1-V_{TH}+V_{ON1})/R$$

and $$I_{T2}=I_B+(Vdd_2-V_{TH}+V_{ON2})/R.$$

The delay will remain constant, if $$I_{T1}Vdd_1=I_{T2}Vdd_2$$

or $$(I_{T2}-I_{T1})/I_{T1}=(Vdd_2-Vdd_1)/Vdd_1, \text{ assuming that } I_B \text{ stays constant.}$$

That is, the total current needs to change proportionally to the supply voltage in order to maintain the same delay. Accordingly, substituting for $I_{T2}$ and $I_{T1}$ in the above equation, $$(Vdd_2-Vdd_1)/Vdd_1=\{[(Vdd_2-Vdd_1)-(V_{ON2}-V_{ON1})]/R\}/\{I_B+[Vdd_1-(V_{TH}+V_{ON1})]/R\}.$$

Assuming that $V_{TH}$ remains unchanged, $V_{ON1}$<$V_{ON2}$, and $V_{ON1}$, $V_{ON2}$<<$V_{TH}$, $I_B$+[$Vdd_1$−($V_{TH}$+$V_{ON1}$)/R]=$Vdd_1$/R, so that, $$I_B=(V_{TH}+V_{ON1})/R$$

or $$R=(V_{TH}+V_{ON1})/I_B$$

Since $V_{TH}$+$V_{ON1}$ is typically about 0.7 volts, R can be determined, once a value for $I_B$ is chosen. In actual practice $I_B$ is chosen so that for a given delay value $t_d$, reasonable values of R and C (load capacitance of the inverter) are selected.

It is appreciated that the bias circuit 20 can be coupled to all of the inverters 12a of the delay generating stages S1 and S2. Thus, in FIG. 4, if the inverter 12a shown is for the stage S1, the output of the inverter 12a would be coupled to the input of stage S2 (as shown in FIG. 2). The bias circuit 20 would be coupled to S2 as well. The fast inverters 12b of stages S3 and S4 do not require the current compensation and are designed not to introduce appreciable delay.

The delay circuit of the present invention can be utilized in a variety of applications. For example, the delay circuit can be implemented in oversampling type modulators. One type of oversampling modulator is a delta-sigma ($\Delta\Sigma$) modulator, in which switched capacitor integrator stages are used for analog-to-digital and digital-to-analog converters (ADCs and DACs). An advantage of $\Delta\Sigma$ ADCs and DACs is that the sampling frequency is much higher than the required Nyquist rate (the Nyquist rate is twice the highest input frequency to be sampled). The higher sampling frequency allows for improved signal conversion, but the higher frequency component must be filtered after the conversion is completed.

Figure 5:
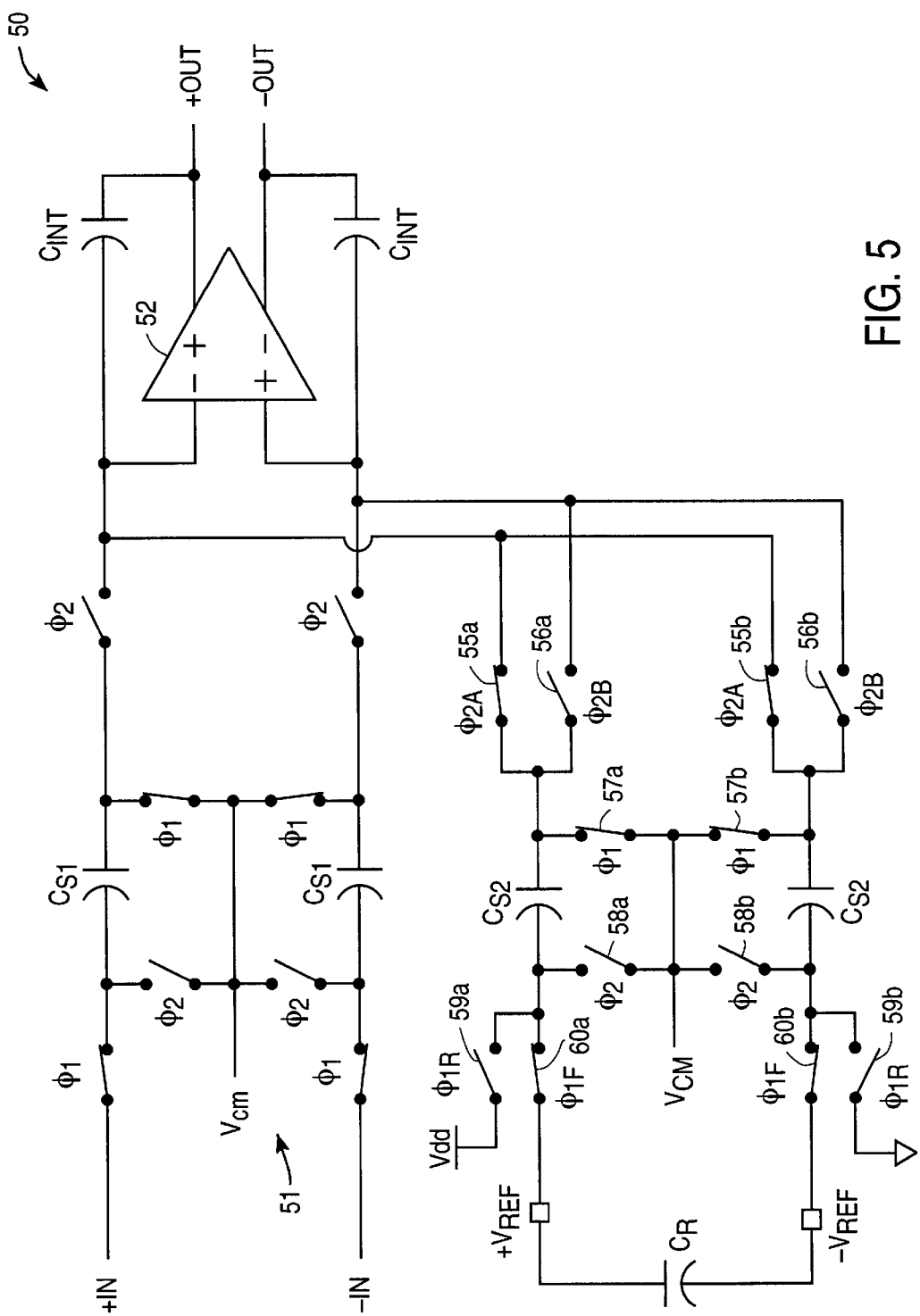
FIG. 5 is a schematic circuit diagram of a differential integrator stage used in an analog-to-digital converter, in which the delay clocking signals generated by the delay circuit of the present invention allows for rough and fine charging/discharging of an input sampling node.

Referring to FIG. 5, a switched capacitor integrator circuit 50 is shown. Circuit 50 is a fully-differential integrator stage in which switched capacitor input circuitry 51 is used to sample a differential input (+IN and −IN). In the particular example shown in FIG. 5, the circuit 50 is utilized as an input stage of a multiple-stage oversampling modulator (such as a $\Delta\Sigma$ modulator) for providing analog-to-digital conversion.

An integrator 52, having integrating capacitors $C_{INT}$ in each of the feedback path from the differential output (+OUT and −OUT) to its input, provides the integration of the sampled analog input. The input circuit is comprised of a sampling capacitor $C_{S1}$ for each input line of the differential input for sampling the input signal. The frequency of the sampling is determined by the operation of the switched capacitors, which closing/opening is synchronized to clocking signals $\phi_1$ and $\phi_2$, as noted in FIG. 5. Thus, during time $\phi_1$ the input is sampled by the sampling capacitors, and during $\phi_2$ the sampled signal is coupled to the input of the integrator 52. The common connection is noted as $V_{CM}$ to denote the common mode voltage of differential amplifiers.

In order to provide the sampling, the input signal is sampled and compared to a reference voltage $V_{REF}$. Typically, the $+V_{REF}$ and the $-V_{REF}$ terminals are coupled to an external capacitor $C_R$, in ordered to provide a filtered voltage as a reference source. The $+V_{REF}$ and the $-V_{REF}$ terminals are coupled to a pair of sampling capacitors $C_{S2}$ during $\phi_1$, when switches 57a–b and either switches 59a–b or 60a–b close. During $\phi_2$ the sampled signal is coupled to the input of the integrator 52, when switches 58a–b and either switches 55a–b or 56a–b close, where it is summed with the sampled input signal at the integrator input nodes. The $+V_{REF}$ and the $-V_{REF}$ lines are coupled to the integrator input by the operation of switches 55a–b and 56a–b, according to an one-bit data output of the modulator. For example, if the feedback is "1", then the $+V_{REF}$ is coupled to the minus input of the integrator 52 and if the feedback is "0", the $+V_{REF}$ is coupled to the plus input. That is, the switches 55a and 55b close when feedback equals "1" (denoted as time period $\phi_{2A}$), at which time the switches 56a–b are open. The switches 56a and 56b close when feedback equals "0" (denoted as time period $\phi_{2B}$), at which time the switches 55a–b are open. The "A" and "B" designations for $\phi_2$ are used to denote the two states of the feedback from the modulator output for activating these switches.

During $\phi_1$ the switches 57a–b close. Also during $\phi_1$ switches 59a–b and 60a–b close, but not at the same time. The switches 59a–b and 60a–b are operated by the clocking signals $\phi_R$ and $\phi_F$ shown in FIG. 1. The $\phi_R$ signal transitions high and closes switches 59a–b first, allowing the input summing nodes to charge/discharge toward Vdd/Gnd. Then switches 59a–b open after time $T_R$ and switches 60a–b close with the transition to $\phi_F$. This technique allows rough charging/discharging of the reference capacitor nodes initially, followed by a fine leveling of the voltage $+V_{REF}/-V_{REF}$ at the reference capacitor nodes. The coarse or rough charging/discharging (by the closing of switches 59a–b) allows DC voltages to be used to bring the integrator input nodes faster toward the appropriate $V_{REF}$ value (which is Vdd), so that when the actual filtered $V_{REF}$ potential is switched in, only a fine adjustment is required. This technique inhibits large load swings to be impressed on the $V_{REF}$ reference lines, which could cause performance degradation and harmonic distortion in the converter. However, in order to utilize this technique, it is preferable to maintain the delay period $T_R$ as constant as possible. The practice of the present invention to maintain the delay period $T_R$ substantially constant, minimizes variations in the operation of the switches 59a–b and 60a–b.

Figure 6:
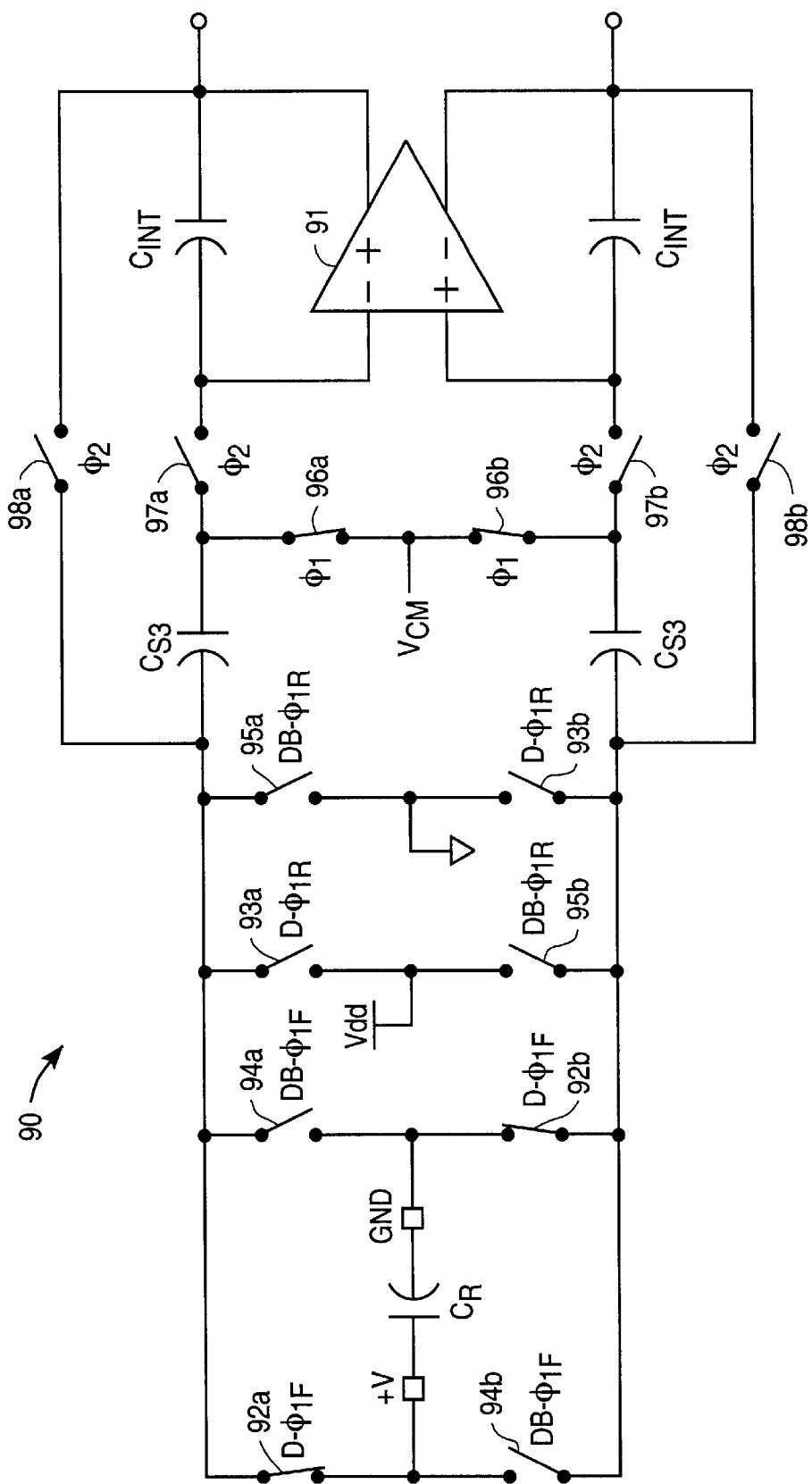
FIG. 6 is a schematic circuit diagram of a differential integrator stage used in an digital-to-analog converter, in which the delay clocking signals generated by the delay circuit of the present invention allows for rough and fine charging/discharging of an input sampling node.

Another example is illustrated in FIG. 6. A fully differential integrator stage 90 is shown, which is utilized as an input stage of a modulator utilized for digital-to-analog conversion. A filtered voltage source is again used with the integrator stage 90 to provide a voltage +V as the input to an integrator 91. Again, a switched-capacitor circuitry is used to provide the input sampling. The actuation of input switches during go depends on the value of the digital data (0 or 1). In the example shown in FIG. 6, one digital stage is denoted as D and the other state is denoted as DB. Thus, during $\phi_1$ switches 96a–b will close along with either switches 92a–b or 93a–b, if the digital input state is D. Alternatively, switches 96a–b will close along with switches 94a–b and 95a–b, if the digital state is DB. During $\phi_2$ switches 97a–b and 98a–b close to couple the signal to the integrator 91.

As with the ADC circuit of FIG. 5, the DAC circuit of FIG. 6 uses rough and fine charging sequence of sampling capacitors $C_{S3}$, to improve integrator performance. Accordingly, during the rough charging ($T_R$) phase $\phi_{1R}$, switches 93a–b or switches 95a–b will close, depending on the data value. Then, during $\phi_{1F}$ switches 92a–b or 94a–b will close, again depending on the data value. The generation of the ($\phi_{1R}$ and $\phi_{1F}$ signals are obtained from the $T_R$ and $T_F$ diagram of FIG. 1, again with the practice of the present invention.

It is appreciated that some integrated circuit devices may not experience a significant variation in the supply voltage during normal operation. However, some integrated circuit devices are designed intentionally for a significant variation in voltage. For example, portable computing and signal processing devices may require integrated circuits to operate across a range of supply voltages. A specification may require the device supplier to provide circuitry capable of operating between 1.6 to 3.6 volts. A device will need to operate over a 2-volt supply voltage variation, similar to the example noted in reference to the circuitry described in FIG. 4. In this instance, without some means of compensation, the analog-to-digital converter (ADC) and digital-to-analog converter (DAC) circuits of FIGS. 5 and 6 would not provide a consistent $\phi_R$ and $\phi_F$ clocking. The practice of the present invention provides the compensation, so that $T_R$ variation is minimized across the 1.6–3.6 supply voltage range.

Figure 7:
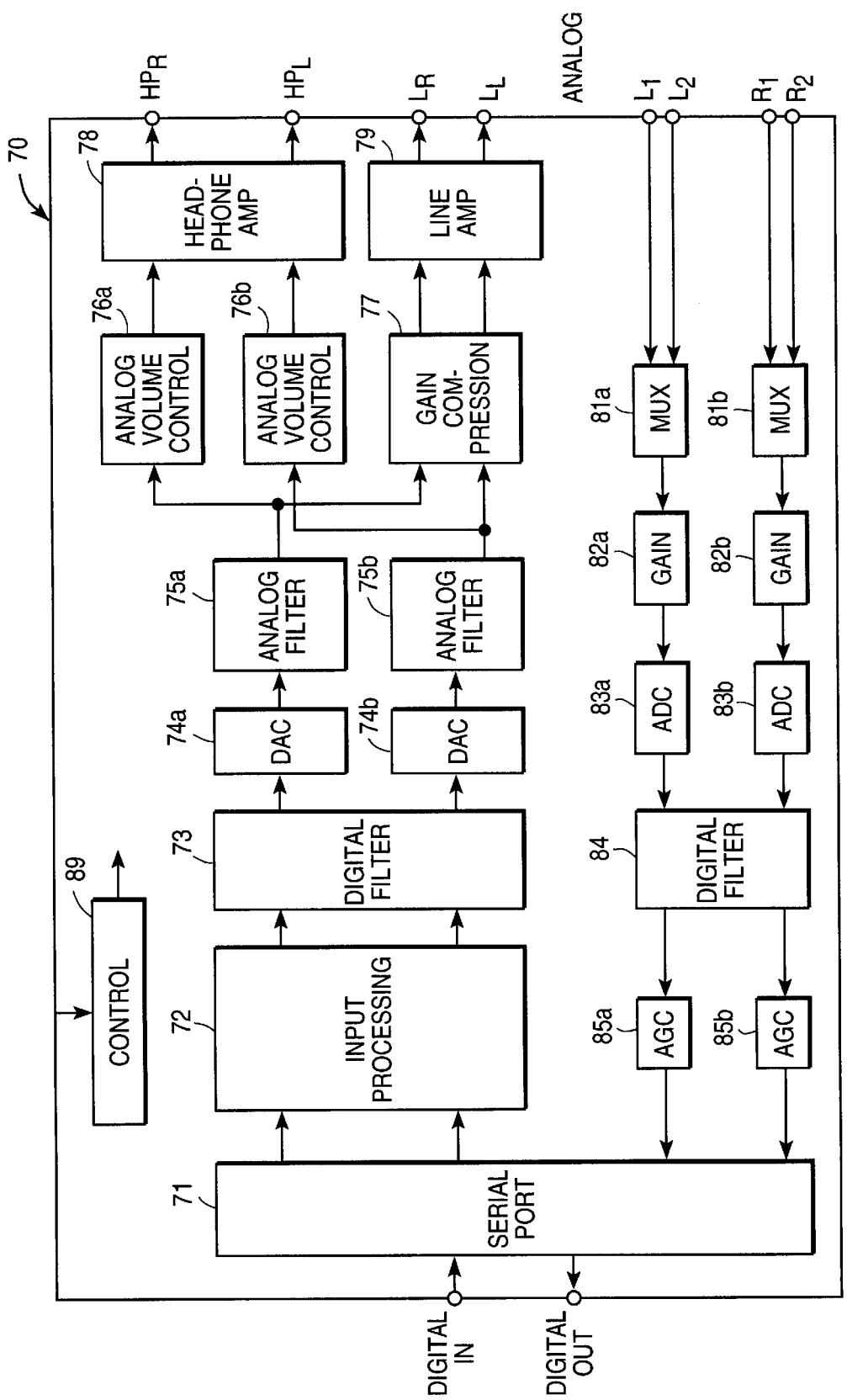
FIG. 7 is a block diagram of a CODEC which implements the circuits of FIGS. 5 and 6 to provide analog-to-digital and digital-to-analog conversions.

It is appreciated that the delay circuit of the present invention can be utilized in a variety of ways and implemented in a variety of systems. In FIG. 7, a low-voltage, stereo audio coder-decoder (CODEC) integrated circuit chip 70 is shown in which digital input/output is at the left and the analog input/output is at the right. A serial port receives a digital input and separates the right (R) and left (L) channels of the stereo signal. The signals are coupled to an input processing circuit 72. The circuit 72 provides de-emphasis, volume control, base/treble control, boost, compression limiting etc. and sends the signal to a digital filter 73, prior to signal conversion. The filtered digital signals are converted to analog signals by a pair of DACs 74a–b. The DACs 74a–b utilize ΔΣ modulators for providing the conversion. The converted outputs are filtered by a pair of analog filters 75a–b to remove the high sampling frequencies and retrieve the lower frequency audio analog signals.

The R and L analog outputs are coupled to respective volume controls 76a–b, which when amplified by a headphone amplifier 78, provides stereo audio outputs ($HP_R$ and $HP_L$) to a headphone coupled to the chip 70. The analog outputs are also coupled to a gain compression circuit 77 before being amplified by a line amplifier 79 to provide line outputs ($L_R$ and $L_L$).

In the opposite direction for signal processing, stereo analog inputs are received at L1/L2 and R1/R2 terminals. The R and L analog inputs are coupled to a pair of multiplexers (MUXs) 81a–b, for selecting between different inputs. After the gain is adjusted by a pair of gain amplifiers 82a–b, the analog signals are coupled to a pair of ADCs 83a–b. The ADCs 83a–b also utilize ΔΣ modulators for high frequency sampling to provide the conversion. A digital filter 84 is used to remove the high frequency component and retrieve the converted filtered signal. The digital signal is processed by an automatic gain control (AGC) circuit by respective AGC circuits 85a–b, then coupled to the serial port 71 for providing a digital output from the chip 70.

Also, noted is a control circuit 89, which receives control signals from an external circuitry and generates necessary on-chip signals. It is appreciated that other signal lines and terminals are not shown, but are understood to be present for operation of the chip 70. Such signals include, clocking signals, reset signals, supply voltages and grounds.

In the particular example, the differential integrator circuit 50 shown in FIG. 5 is utilized in the initial stage of a multiple-stage (higher order) ΔΣ modulator, which is implemented in the ADCs 83a and 83b. The integrator circuit 90 shown in FIG. 6 is utilized in the DACs 74a and 74b. The CODEC 70 is capable of operating with a supply voltage in the approximate range of 1.6–3.6 volts. Accordingly, the CODEC 70 is suitable for use in portable devices, such as portable audio CD (compact disk) players, MPs and MD recorders and other portable systems that require extremely low power consumption.

It is appreciated that an ADC and a DAC examples are described above in order to illustrate implementations of the present invention. However, the invention need not be limited to such application only. The control of the delay time can be used in other circuits as well. Furthermore, as shown in FIG. 8, improvements can be designed without departing from the spirit and scope of the invention. In FIG. 8, the delay circuit of FIG. 2 is again illustrated as circuit 11a, but with the inclusion of additional inverters 8 and 9 within each of the slow stages S1 and S2. The pair of inverters 8 and 9 (inverter 8 at the input of inverter 12a and inverter 9 at the output of inverter 12a) are used to ensure a sharp edge at the transition to reduce sensitivity to Vdd/Gnd noise that could potentially affect the transistor switching point, resulting in poor jitter performance.

Furthermore, the present invention can be readily implemented to provide a plurality of delays by utilizing a plurality of above-described circuitry. For example, a sequence of delays can be implemented by having a subsequent delay initiated in response to a currently occurring delay. Thus, multiple number of delays can be generated by the practice of the present invention.

Thus, the present invention, comprising an open-loop supply independent digital/logic delay circuit, allows a delay circuit to minimize delay time variations when the supply voltage varies.

We claim:

1. An apparatus comprising:
    a delay stage to receive an input signal and to generate an output signal which is delayed from the input signal by a predetermined delay;
    a bias circuit coupled to said delay stage to control a delay stage current in said delay stage, in which a supply voltage to said delay stage and the delay stage current determine the predetermined delay;
    said bias circuit coupled to the supply voltage to provide a bias current having a fixed component and a variable component, wherein the fixed component of the bias current remains constant when the supply voltage varies, but the variable component of the bias current changes proportionately to the variation in the supply voltage; and
    the bias current coupled to control the delay stage current to adjust the delay stage current proportionately to variations in the supply voltage to minimize changes in the predetermined delay when the supply voltage varies.

2. The apparatus of claim 1 wherein said bias circuit and said delay stage comprise a current mirror, in which the delay stage current mirrors the bias current to control the predetermined delay.

3. The apparatus of claim 2 wherein the fixed component remains constant by having a reference voltage which follows variations in the supply voltage to drive the fixed component of the bias current to maintain the fixed component constant.

4. The apparatus of claim 3 wherein the variable component of the bias current is determined by a resistor coupled to the supply voltage, in which the variable component of the bias current flows through the resistor and changes proportionately to the variations in the supply voltage.

5. The apparatus of claim 1 wherein said delay stage includes an inverter loaded by a capacitive component, in which an inverter current which charges or discharges the capacitive component is controlled by the bias current.

6. The apparatus of claim 5 wherein said delay stage comprises a plurality of separate delay stages and in which said bias circuit is coupled to control the inverter current of each of the stages, each stage contributing to the predetermined delay.

7. A delay circuit for minimizing a variation in a delay period of a delayed signal comprising:
    a delay stage to receive an input signal and to generate the delayed signal which is delayed from the input signal by the delay period;
    a bias circuit coupled to said delay stage to control a delay stage current in said delay stage, in which a supply voltage to said delay stage and the delay stage current determine the delay;
    said bias circuit coupled to the supply voltage to provide a bias current having a fixed component and a variable component, wherein the fixed component of the bias current remains constant when the supply voltage varies, but the variable component of the bias current changes proportionately to the variation in the supply voltage; and the bias current coupled to control the delay stage current to adjust the delay stage current proportionately to variations in the supply voltage to minimize changes in the delay when the supply voltage varies.

8. The delay circuit of claim 7 wherein said delay stage includes one or more inverters loaded by a capacitive component, in which an inverter current which charges or discharges the capacitive component is controlled by the bias current.

9. The delay circuit of claim 7 wherein the fixed component of the bias current remains constant by having a reference voltage which follows variations in the supply voltage to drive the fixed component of the bias current to maintain the fixed component constant.

10. The delay circuit of claim 9 wherein said circuit component for introducing the delay in the inverter includes a capacitive load and the delay is determined by charging or discharging the capacitive load to reach a transition level.

11. The delay circuit of claim 10 wherein said delay stage comprises a plurality of separate delay stages and in which said bias circuit is coupled to control the inverter current of each of the stages, each stage contributing to a delay.

12. The delay circuit of claim 7 in which the variable current component of the bias current is increased proportionately in response to an increase in the supply voltage and decreased proportionately in response to a decrease in the supply voltage.

13. The delay circuit of claim 9 in which the variable component of the bias current is determined by a resistor coupled to the supply voltage, in which the variable component of the bias current flows through the resistor and changes proportionately to the variation in the supply voltage.

14. An apparatus to provide analog-to-digital or digital-to-analog conversion comprising:

a switching circuit to sample a digital signal for conversion to an analog signal or to sample an analog signal and for conversion to a digital signal;

a delay circuit, having one or more delay stages, for providing two clocking signals to clock sampling switches of said switching circuit, but in which a second clocking signal follows a first clocking signal by a predetermined delay, said delay circuit minimizing a variation in the predetermined delay;

a bias circuit coupled to the one or more delay stages to control a delay stage current in each of the delay stages, in which a supply voltage to each delay stage and the delay stage current for each stage determine the predetermined delay;

said bias circuit coupled to the supply voltage to provide a bias current having a fixed component and a variable component, wherein the fixed component of the bias current remains constant when the supply voltage varies, but the variable component of the bias current changes proportionately to the variation in the supply voltage; and the bias current coupled to control each delay stage current to adjust each delay stage current proportionately to the variation in the supply voltage to minimize changes in the predetermined delay when the supply voltage varies.

15. The apparatus of claim 14 wherein each delay stage includes an inverter loaded by a capacitive component, in which an inverter current which charges or discharges the capacitive component is controlled by the bias current.

16. The apparatus of claim 15 wherein said bias circuit and each delay stage comprise a current mirror, in which each delay stage current mirrors the bias current to control the predetermined delay.

17. The apparatus of claim 16 in which the variable current component of the bias current is increased proportionately in response to an increase in the supply voltage and decreased proportionately in response to a decrease in the supply voltage.

18. The apparatus of claim 17 in which the variable component of the bias current is determined by a resistor coupled to the supply voltage, in which the variable component of the bias current flows through the resistor and changes proportionately to the variations in the supply voltage.

19. The apparatus of claim 14 wherein said converter circuit includes a delta-sigma converter.

20. A method to provide a delay in a circuit in which a timing of the delay is independent of supply voltage variation comprising:

receiving an input signal;

generating a delayed signal in response to the input signal in a delay stage, in which the delayed signal has a predetermined delay from the input signal;

providing a bias current to control a delay stage current in the delay stage in which a supply voltage to the delay stage and the delay stage current determine the predetermined delay;

the bias current sourced from the supply voltage and having a fixed component and a variable component, wherein the fixed component of the bias current remains constant when the supply voltage varies, but the variable component of the bias current changes in proportionately to the variation in the supply voltage; and the bias current coupled to control the delay stage current to adjust the delay stage current proportionately to the variation in the supply voltage to minimize changes in the predetermined delay when the supply voltage varies.

21. The method of claim 20 further comprises commencing a second clocking signal the predetermined delay after a first clocking signal.

22. The method of claim 21 further comprises using the two clocking signals to clock sampling switches to sample analog or digital signals.

23. The method of claim 20 wherein the fixed component of the bias current remains constant by having a reference voltage which follows variations in the supply voltage to drive the fixed component of the bias current to maintain the fixed component constant.

24. The method of claim 23 wherein the variable component of the bias current is increased proportionately in response to an increase in the supply voltage and decreased proportionately in response to a decrease in the supply voltage.

25. The method of claim 24 wherein the variable component of the bias current is determined by a resistance coupled to the supply voltage, in which the variable component of the bias current flows through the resistor and changes proportionately to the variation in the supply voltage.

* * * * *

UNITED STATES PATENT AND TRADEMARK OFFICE
CERTIFICATE OF CORRECTION

PATENT NO.    : 6,262,616 B1
DATED         : July 17, 2001
INVENTOR(S)   : Vishnu S. Srinivasan et al.

It is certified that error appears in the above-identified patent and that said Letters Patent is hereby corrected as shown below:

<u>Column 11,</u>
Line 32, please delete "9", and insert -- 12 --.

Signed and Sealed this

Fourteenth Day of May 2002

*Attest:*

*Attesting Officer*

JAMES E. ROGAN
*Director of the United States Patent and Trademark Office*